(12) United States Patent
Bateman et al.

(10) Patent No.: US 9,478,679 B2
(45) Date of Patent: Oct. 25, 2016

(54) DIELECTRIC COATING OF THE EDGE OF A SOLAR CELL

(71) Applicant: Varian Semiconductor Equipment Associates, Inc., Gloucester, MA (US)

(72) Inventors: Nicholas P. T. Bateman, Reading, MA (US); Vikram M. Bhosle, North Reading, MA (US); Bon-Woong Koo, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/551,278

(22) Filed: Nov. 24, 2014

(65) Prior Publication Data

US 2015/0162457 A1    Jun. 11, 2015

Related U.S. Application Data

(60) Provisional application No. 61/914,499, filed on Dec. 11, 2013.

(51) Int. Cl.

| | |
|---|---|
| *H01L 31/0216* | (2014.01) |
| *H01L 21/02* | (2006.01) |
| *H01L 31/18* | (2006.01) |
| *H01L 31/068* | (2012.01) |

(52) U.S. Cl.
CPC ... *H01L 31/02167* (2013.01); *H01L 21/02118* (2013.01); *H01L 31/068* (2013.01); *H01L 31/1804* (2013.01); *H01L 31/1864* (2013.01); *Y02E 10/547* (2013.01); *Y02P 70/521* (2015.11)

(58) Field of Classification Search
CPC ............... H01L 21/02109; H01L 21/02518
See application file for complete search history.

(56) References Cited

U.S. PATENT DOCUMENTS

| | | |
|---|---|---|
| 8,322,300 B2 | 12/2012 | Pavani et al. |
| 2008/0128013 A1 | 6/2008 | Lopatin et al. |
| 2010/0177384 A1 | 7/2010 | Peroz et al. |
| 2012/0171807 A1 | 7/2012 | Berger et al. |
| 2013/0140649 A1 | 6/2013 | Rogers et al. |
| 2013/0224938 A1 | 8/2013 | Bateman et al. |

OTHER PUBLICATIONS

International Search Report and Written Opinion mailed Mar. 13, 2015 in corresponding PCT application No. PCT/US2014/067240.

*Primary Examiner* — Cheung Lee
(74) *Attorney, Agent, or Firm* — Nields, Lemack & Frame, LLC

(57) ABSTRACT

A method of processing a solar cell is disclosed, where the edges of the solar cell are covered, coated or masked during the ion implantation process and/or the screen printing process. This covering may be a substance that blocks the penetration of ions during implantation, or may be a substance that resists the diffusion of fritted metal paste during the metallization process. In some embodiments, the edges are covered during both of these processes. In further embodiments, the same material may perform both functions.

13 Claims, 3 Drawing Sheets

DIELECTRIC COATING OF THE EDGE OF A SOLAR CELL

This application claims priority of U.S. Provisional Patent Application 61/914,499, filed Dec. 11, 2013, the disclosure of which is incorporated by reference in its entirety.

FIELD

Embodiments of the present disclosure relate to methods for improving reverse current of solar cells, and more particularly, methods of reducing reverse current caused by current paths formed along the edges of the cells.

BACKGROUND

Semiconductor workpieces are often implanted with dopant species to create a desired conductivity. For example, solar cells may be implanted with a dopant species to create an emitter region. This implant may be done using a variety of different mechanisms. The creation of an emitter region allows the formation of a p-n junction in the solar cell. As light strikes the solar cells, electrons are energized, creating electron-hole pairs. The minority carriers, which are created by the energy from incident light, are swept across the p-n junction in the solar cell. This creates a current, which can be used to power an external load.

Solar cells are often arranged in arrays, where one or more solar cells are arranged in parallel. When all of the solar cells are illuminated, all generate current. However, when one of the cells is shaded, that cell will not produce any current. Furthermore, the shaded solar cell may experience reverse current, where, due to the voltage applied on either side of the p-n junction, current flows through the solar cell in the reverse direction. This may have detrimental effects on the entire solar cell array by heating small regions of the solar cell to excessive temperatures.

Reverse current is a known phenomenon that results from the configuration of the solar cell. However, the thermal effect of the reverse current may be exacerbated by defects or other anomalies in the manufacturing process. For example, reverse current can be increased by imprecise doping of the solar cell or by poor metallization control during the manufacture of the device.

Therefore, a method that improves the manufacturing process associated with solar cells, and particularly reduces reverse current, would be beneficial.

SUMMARY

A method of processing a solar cell is disclosed, where the edges of the solar cell are covered, coated or masked during the ion implantation process and/or the screen printing process. This covering may be a substance that blocks the penetration of ions during implantation, or may be a substance that resists the dissolution into fritted metal paste during the metallization process. In some embodiments, the edges are covered during both of these processes. In further embodiments, the same material may perform both functions.

In one embodiment, a method for processing a solar cell comprises applying a blocking material to an edge of the solar cell; implanting dopants into at least one surface of said solar cell after applying the blocking material so the blocking material serves to block dopant from implanting the edge of the solar cell; and subjecting the solar cell to a thermal treatment after the implant to diffuse the implanted dopant into the solar cell.

In a further embodiment, the method also recites that the blocking material comprises a polymeric dielectric precursor, where the thermal treatment allows the polymeric dielectric precursor to transform into an inorganic dielectric material. In another further embodiment, the method also comprises screen printing metal paste onto the solar cell after subjecting it to the thermal treatment, such that the inorganic dielectric material prevents the metal paste from permeating the edges of the solar cell. In one further embodiment, the thermal treatment comprises an anneal process to allow the dopant to diffuse into the implanted surface.

In another embodiment, the method for processing the solar cell further comprises removing the blocking material after implanting dopants. In another further embodiment, the blocking material is removed by the thermal treatment. In a further embodiment, the process further comprising applying a polymeric dielectric precursor to the edges after removing the blocking material; subjecting the solar cell to a thermal treatment to transform the polymeric dielectric precursor into an inorganic dielectric material; and screen printing metal paste onto the solar cell after subjecting the solar cell to the thermal treatment.

In one embodiment, the blocking material comprises a viscous fluid. In a further embodiment, the blocking material is sprayed onto the edges. In a second further embodiment, the blocking material is brushed onto the edges.

In a second embodiment, a method of processing a solar cell comprises applying a polymeric dielectric precursor to an edge of the solar cell; subjecting the solar cell to a thermal treatment after applying the polymeric dielectric precursor, wherein the polymeric dielectric precursor is transformed into an inorganic dielectric material by the thermal treatment; and screen printing fritted metal paste onto the solar cell after applying the polymeric dielectric precursor, such that the inorganic dielectric material prevents the fritted metal paste from permeating the edge of the solar cell.

In a further embodiment, the thermal treatment comprises an anneal process used to diffuse dopants into the solar cell.

In a further embodiment, the method further comprises implanting dopants into at least one surface of the solar cell, wherein the thermal treatment is also used to diffuse the dopants into the solar cell.

In another further embodiment, the thermal treatment comprises a firing process to diffuse the fritted metal paste. In some embodiments, the solar cell is subjected to the thermal treatment after the screen printing.

In one embodiment, the polymeric dielectric precursor is a viscous material. In a further embodiment, the polymeric dielectric precursor is made stable through a short low temperature process. In a second further embodiment, the polymeric dielectric precursor is made stable through UV illumination. In some embodiments, the thermal process is performed at a temperature of less than 800° C.

In some embodiments, the polymeric dielectric precursor is not readily absorbed by the fritted paste.

In another embodiment, an apparatus of creating a solar cell is disclosed. The apparatus comprises a material application stage to apply a material to an edge of the solar cell; an ion implanter to implant dopants into at least one surface of the solar cell; and a heated chamber, disposed downstream from the ion implanter, to anneal the dopant in the solar cell.

In a further embodiment, the material application stage is disposed at an inbound stage of the ion implanter. In one embodiment, the apparatus also comprises a material removal stage disposed at an outbound stage of the ion implanter, prior to the heated chamber.

In a different embodiment, the material application stage is disposed at an outbound stage of the ion implanter, prior to the heated chamber.

In one embodiment, the material application stage applies material to a stack of solar cells.

In one embodiment, the apparatus further comprises a screen printer to print a fritted paste onto the solar cell, disposed downstream of the heated chamber, wherein the material application stage is disposed in the screen printer.

In another embodiment, an apparatus of creating a solar cell is disclosed. The apparatus comprises an ion implanter; and at least one of: a material application stage disposed at an inbound or outbound stage of the ion implanter, to apply a blocking material to an edge of the solar cell; and a material removal stage disposed at an outbound stage of the ion implanter, to remove the blocking material.

In another embodiment, the resulting solar cell may include an inorganic dielectric layer along its edge after processing. This inorganic dielectric layer may be left on the solar cell, or may be removed if desired. This inorganic dielectric layer may be amorphous silicon carbide. Further, the resulting solar cell may have fritted metal paste disposed on at least one of the front surface and the rear surface, where the fritted metal paste does not permeate the inorganic dielectric layer.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
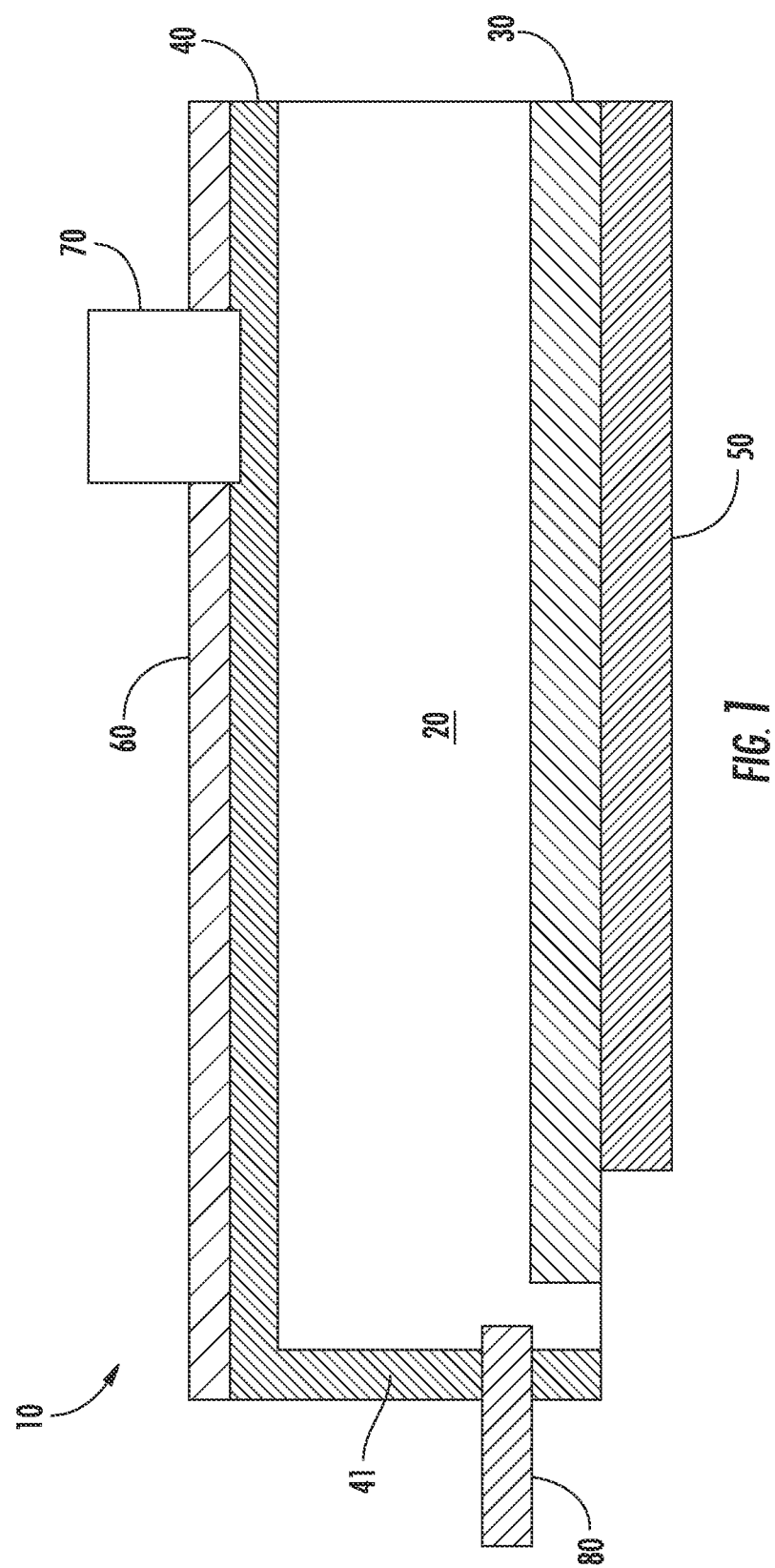
FIG. 1 shows the failure mechanism that results in increased reverse current.

As described above, reverse current of a solar cell may negatively impact its performance, and the performance of a solar cell array. FIG. 1 shows one particular failure mechanism that leads to increased reverse current in a solar cell. In this embodiment, the solar cell 10 includes a p-doped bulk region 20, a p++-doped back side field (BSF) 30, and an n++-doped emitter 40. The interface between n++-doped emitter 40 and the p-doped bulk region 20 creates the p-n junction. The p++-doped BSF 30 provides a lower resistance path to which the metal contacts 50 are attached. An anti-reflective coating (ARC) 60 may be applied on top of the n++-doped emitter 40. Metal contacts 70 may also be disposed on the front surface, in contact with the n++-doped emitter 40. Of course, other solar cell configurations are also possible; FIG. 1 is illustrative of the causes of high reverse current and the disclosure is not limited to any particular solar cell configuration.

The reverse current of solar cell 10 may be affected by two factors. First, during the implantation process, dopants may be implanted into the edge of the solar cell, in addition to the front surface (or rear surface). Thus, in the embodiment of FIG. 1, the edge of the solar cell may also include an n++-doped region 41. In other embodiments, the edge of the solar cell may become p++-doped. Additionally, during the metallization process, unwanted metal paste 80 may be disposed on the edge of the solar cell. During the firing process, this metal paste 80 may permeate the solar cell and create a path from the p-doped bulk region 20 into the n++-doped region 41.

Elimination of the n++-doped region 41, the metal paste 80, or both will result in a decrease in the reverse current of the solar cell 10. Therefore, techniques which eliminate at least one of these factors may be beneficial.

Before describing various techniques to reduce reverse current, a brief review of representative manufacturing processes of various solar cells is presented. In each, additional processes may be included to reduce reverse current, as described below.

Figure 2:
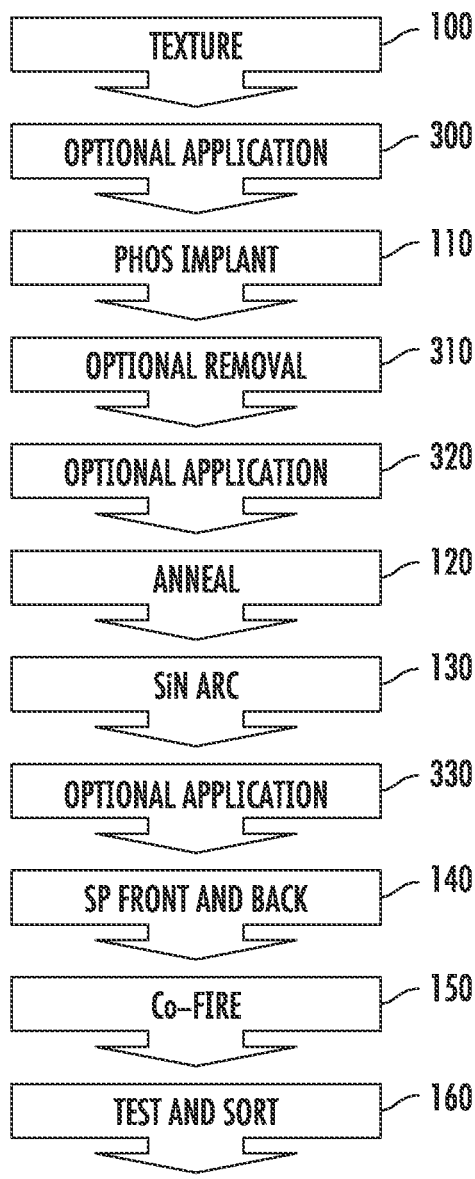
FIG. 2 is a representative manufacturing flow for a conventional solar cell according to one embodiment.

FIG. 2 shows a representative flow for the manufacture of a conventional solar cell. First, as shown in Box 100, the substrate is textured. In some embodiments, both surfaces of the substrate are textured, although texture may also only be supplied to the front surface. An n-type implant is then performed to the front surface, as shown in Box 110, to create the n++-doped emitter, shown in FIG. 1. The substrate is then exposed to a thermal process, or anneal, as shown in Box 120 to allow the n-type dopant to diffuse into the front surface. An anti-reflective coating (ARC) is then applied to the front surface, as shown in Box 130. This ARC may be silicon nitride (SiN), although other materials may be used. The metal contacts are then applied using screen printing (SP), as shown in Box 140. The metal paste is typically fritted to ensure good contact through the ARC to the solar cell. The substrate is then fired to cause the metal to bond and diffuse into the substrate, as shown in Box 150. The resulting solar cells are then tested and sorted, as shown in Box 160.

Figure 3:
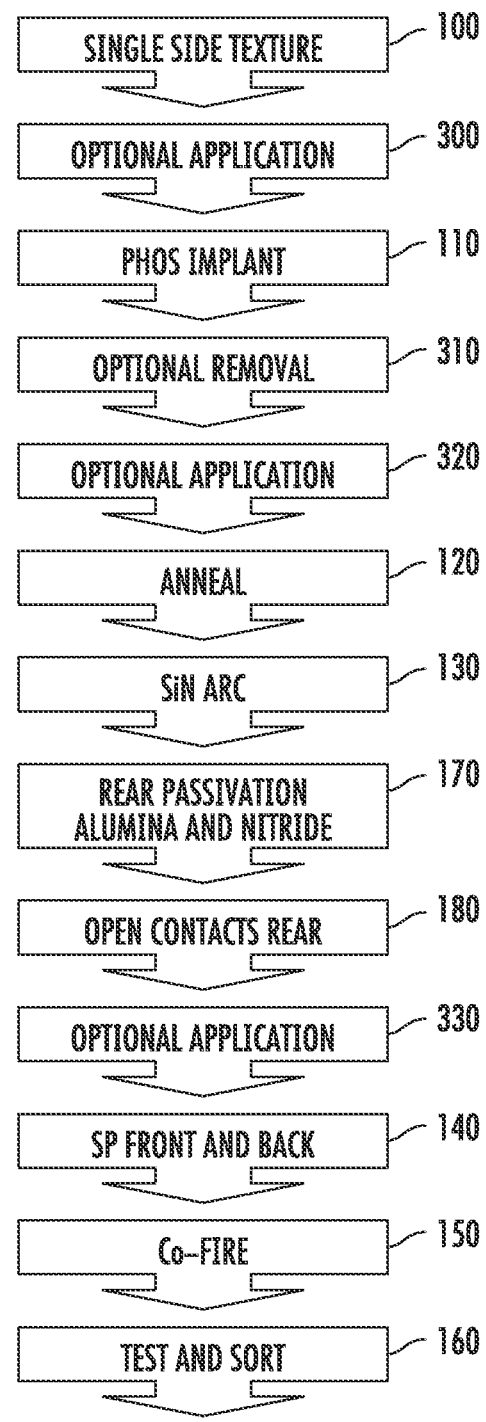
FIG. 3 is a representative manufacturing flow for a PERC solar cell according to one embodiment.

FIG. 3 shows a similar flow for a PERC (passivated emitter, rear contact) solar cell. Similar processes have been given identical reference designators. The process begins in the same manner that of FIG. 2. The substrate is textured, implanted with an n-type dopant, and annealed, as shown in Boxes 100-120. An ARC is then applied, as shown in Box 130. After this, the back surface of the substrate is passivated, such as using alumina and nitride, as shown in Box 170. Since the entire back surface is coated with the passivation layer, openings are created in the rear passivation layer, as shown in Box 180. After this, screen printing, firing and testing are performed as described earlier, as shown in Boxes 140-160.

Figure 4:
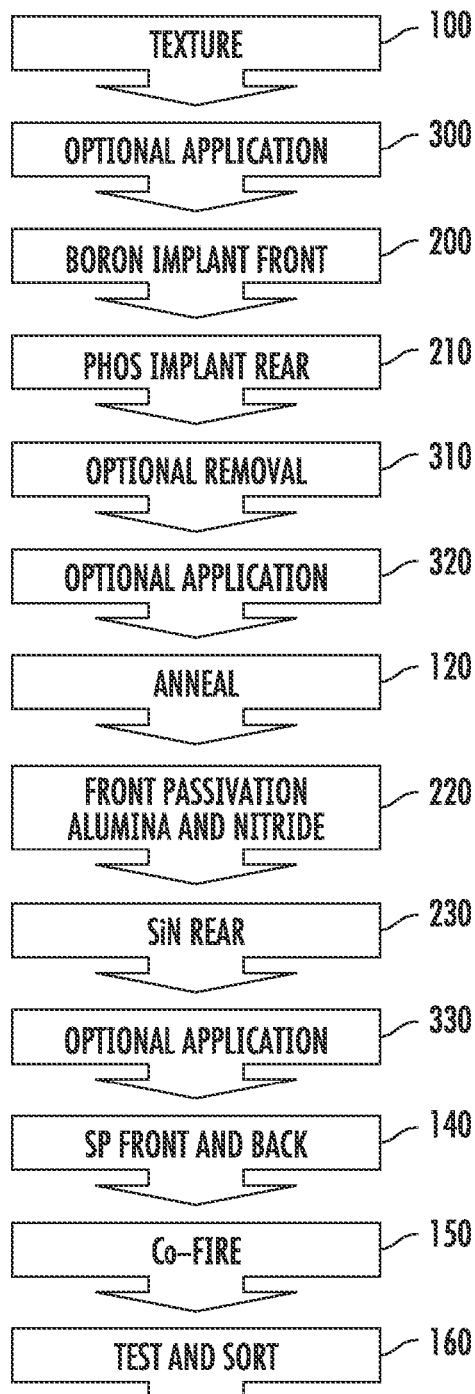
FIG. 4 is a representative manufacturing flow for a PERT solar cell according to one embodiment.

FIG. 4 shows a flow for a PERT (passivated emitter, rear totally diffused) solar cell. In this manufacturing process, the substrate is textured, as shown in Box 100. In this solar cell, the p-type dopant is implanted in the front surface, as shown in Box 200, while the n-type dopant is implanted in the rear surface, as shown in Box 210. The substrate is then exposed to a thermal treatment, such as an anneal cycle, in Box 120 to allow the dopants to diffuse into the substrate. An ARC, which may be composed of layers of alumina and nitride, is then applied to the front side of the cell, as shown in Box 220. In other embodiments, an ARC may be applied to the front surface at this time. A coating is then applied to the rear surface, as shown in Box 230. After this, the metal contacts are screen printed onto the substrate, and fired. The solar cells are then tested and sorted, as shown in Boxes 140-160.

Figure 5:
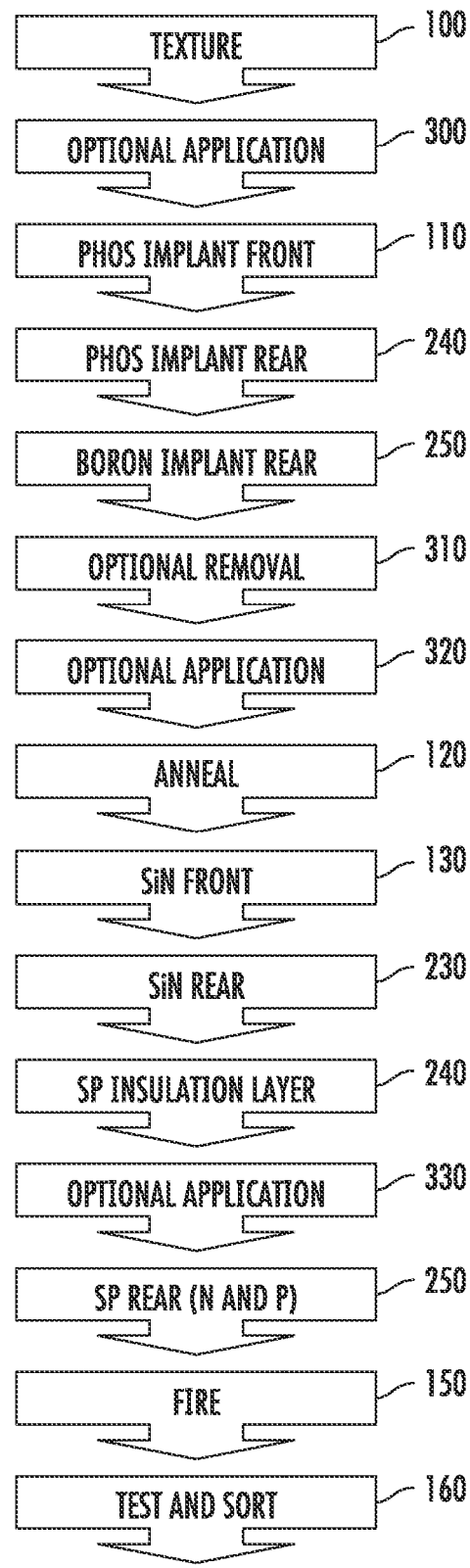
FIG. 5 is a representative manufacturing flow for an IBC solar cell according to one embodiment.

FIG. 5 shows a representative manufacturing process for an interdigitated back contact (IBC) solar cell. In this process, the workpiece is textured, as shown in Box 100. The n-type dopant is implanted into the front surface, as shown in Box 110, and n-type dopant is then implanted in the rear surface, as shown in Box 240. Of course, these processes may be performed in any sequence. The rear surface implant may be a blanket or patterned implant. A p-type dopant is then implanted in the rear surface, as shown in Box 250. Again, this may be a blanket or patterned implant. In addition, this process may be performed before the p-type dopant is implanted in some embodiments. The substrate is then subjected to a thermal process to anneal the dopants, as shown in Box 120. An ARC is then applied to the front surface, as shown in Box 130. Similarly, a coating, such as silicon nitride, is applied to the rear surface, as shown in Box 230. An insulation layer is then screen printed onto the rear surface, and are the metal contacts for both the n-type and p-type regions, as shown in Boxes 240-250. The substrate is then fired, and then tested and sorted, as shown in Boxes 150-160.

As described above, there are two factors which may affect reverse current. The first of these is the inadvertent implanting of dopant along the edge of the solar cell, as shown in FIG. 1. This can occur at various points in the manufacturing process, such as during at least the processes illustrated in Boxes 110, 200, 210, 240 and 250.

To reduce the possibility of dopant being implanted in the edges of the solar cell, the edges of the solar cell may be coated, covered masked, or otherwise blocked using an ink or other material. This blocking material may be a viscous fluid that is readily applied to the edges of the substrate. For example, the blocking material may be brushed onto the edges, sprayed onto the edges, or electro sprayed onto the edges. In some embodiments, the substrates may be dipped into the blocking material to coat the edges. Of course, other methods of applying the blocking material to the edges of the substrate may be used and are within the scope of the disclosure.

To block the implant of dopants into the edges, the blocking material described above may be applied at any point prior to the first implant process in the manufacturing process. With respect to FIGS. 2, 3 and 5, this blocking material may be applied prior to Box 110, such as in Box 300. With respect to FIG. 4, this blocking material may be applied at any point prior to Box 200, such as in Box 300.

Once the implantation processes have been performed, the blocking material may be removed from the edges of the solar cells. In the case of FIGS. 2 and 3, the blocking material may be removed at any point after Box 110, such as Box 310. With respect to FIG. 4, the blocking material may be removed at any point after Box 210, such as Box 310. With respect to FIG. 5, the blocking material may be removed at any point after Box 250. This blocking material may be removed in a number of different ways. For example, a wet process, such as cleaning in alcohol or another solvent, may be used to remove the blocking material. In other embodiments, a plasma process may be used to remove this blocking material. In yet another embodiment, the blocking material evaporated during the anneal process (Box 120), which may eliminate the need for an additional process. If the blocking material is to be removed, it is preferable that any dopant that was introduced to the blocking material is removed with the blocking material and does not diffuse into the edge of the solar cell. However, in other embodiments, this blocking material is not removed after the implantation processes are performed. Rather, this blocking material is simply left on the edge throughout the remainder of the manufacturing process. In such a case, the blocking material may be impervious to diffusion of the implanted dopant though the blocking layer to prevent formation of a doped layer under the blocking layer during a thermal process.

In some embodiments, techniques may be used to block the diffusion of fritted metal paste into the edge of the solar cell. In each of the processes described above, the metal paste is applied during the screen printing process (i.e. Boxes 140, 250).

In some embodiments, the diffusion of fritted metal paste may be blocked by the application of a dielectric material to the edge of the solar cell. For example, dielectric materials such as silicon dioxide, silicon nitride, and silicon oxynitride, may be used to coat the edge of the solar cell. Since most dielectrics are typically ceramic, it may be useful to apply one or more polymeric dielectric precursors, which, upon application of heat, transform into an inorganic dielectric material. For example, a polymeric dielectric precursor may be applied to the edge of the solar cell. The solar cell is then subjected to heat, to allow the polymeric dielectric precursor to form the desired inorganic dielectric. The polymeric dielectric precursor may have one or more of the following attributes. First, the polymeric dielectric precursor may be viscous to the readily applied to the edge of the solar cell. Second, the polymeric dielectric precursor may readily be made stable through a short low temperature process, UV illumination or other simple treatment. For instance, a polymer may form crosslinking bonds after such treatment. Third, this thermal treatment forms an inorganic dielectric or large band gas semiconductor at temperatures preferably less than 800° C. Fourth, the inorganic dielectric is not readily absorbed by the fritted pastes used in the manufacturing process.

After the polymeric dielectric precursor has been applied to the edge of the solar cell, the fritted metal paste may be screen printed onto the solar cell.

In some embodiments, the heat treatment needed to transform the polymeric dielectric precursor into an inorganic dielectric is an added manufacturing process. In these embodiments, the application of the polymeric dielectric precursor and the heat treatment may be performed at any time prior to the screen printing process (i.e. Boxes 140 and 250).

However, in other embodiments, it may be beneficial to utilize a thermal process (such as Box 120 or 150) that is already part of the manufacturing process. In this way, only one extra process needs to be added to the sequence. In this embodiment, the polymeric dielectric precursor is applied prior to the thermal process (Box 120) in each of the manufacturing processes depicted in FIGS. 2-5, such as in Box 320. In this way, the thermal process, which is used to allow diffusion and activation of the dopant, also serves to form the desired inorganic dielectric.

In another embodiment, the heat used during the firing process (i.e. Box 150) may be employed to create the inorganic dielectric from the polymeric dielectric precursor. In this embodiment, the polymeric dielectric precursor is applied prior to the screen printing process (such as, for example, in Box 330). The metal paste is then applied to top of the polymeric dielectric precursor. The firing process (Box 150) serves to pyrolyze the polymeric dielectric precursor into the desired inorganic dielectric, while simultaneously allowing the metal paste to permeate the solar cell to form the contacts. The hardening of the polymeric dielectric precursor may impede the diffusion of fritted metal paste into the edges of the solar cells.

In other embodiments, the polymeric dielectric precursor may be applied contemporaneous with the screen printing. For example, the polymeric dielectric precursor may be applied using a screen printer.

In yet another embodiment, two different materials may be applied to the edges. For example, a blocking material may be applied to the edges of the solar cell prior to the first implantation process. The blocking material may then be removed after the last implantation process. In some embodiments, the blocking material is removed prior to the anneal process (Box 120), such as in Box 310. After the blocking material has been removed, the polymeric dielectric precursor may be applied, such as in Box 320. As described above, the polymeric dielectric precursor may be applied prior to the anneal process (Box 120) so as to harden into the desired inorganic dielectric prior to the screen printing. In other embodiments, the polymeric dielectric precursor is applied either before or during the screen printing, so that the firing process (Box 150) serves to form the desired inorganic dielectric.

In yet another embodiment, the same material serves as both the blocking material and the polymeric dielectric precursor. In this embodiment, the material is applied prior to the first implantation process as a viscous material, such as during Box 300. The implantation process or processes are performed, and the material serves to block dopant from implanting the edge of the solar cell. As the solar cell undergoes the thermal process (i.e. Box 120), the material is transformed into an inorganic dielectric material. This inorganic dielectric material then serves to stop the diffusion of fritted metal paste into the edges of the solar cell.

One particular material that may be used to perform both functions is poly(silylenemethylene), which is polymer that contains both silicon and carbon. This polymer can be applied prior to the implantation processes. At high temperatures, such as those used for the anneal process, this polymer forms amorphous silicon carbide. This silicon carbide then protects the edges from the diffusion of fritted metal pastes.

Thus, various embodiments are described. In some embodiments, a blocking material is applied to the edges of solar cells before the first implantation process. The blocking material may be removed at any point after the last implantation process, or may be left on the edge of the solar cell.

In other embodiments, a polymeric dielectric precursor is applied to the edge of the solar cell before the screen printing process. In further embodiments, the polymeric dielectric precursor is applied prior to the anneal process to allow it to form into the desired inorganic dielectric. In other embodiments, the polymeric dielectric precursor is applied immediately before or during the screen printing and pyrolyzed by the firing operation.

In some other embodiments, a blocking material is applied before the implantation process and removed thereafter. A polymeric dielectric precursor is then applied before the anneal process.

In some embodiments, a single material serves both purposes. The material is applied before the implantation. During the anneal process, the material is transformed into the desired inorganic dielectric, and serves to inhibit the diffusion of the fritted metal paste.

To perform the application of these various materials, the ion implanter may be equipped with one or more material application/removal stages. For example, for the application of a blocking material, a material application stage may be incorporated at the inbound stage of the implanter, so that the edges of the solar cells are coated prior to entering the ion implanter. In addition, if the blocking material is to be removed, a material removal stage may be incorporated at the outbound stage of the ion implanter. For application of a polymeric dielectric precursor, the precursor application stage may be at the outbound stage of the ion implanter, prior to the solar cell being exposed to the anneal process. The anneal process may be performed, for example, in a furnace or other heated chamber.

If two different materials are used, the application stage for the blocking material may be at the inbound stage of the ion implanter. The removal stage for the blocking material and application stage for the precursor material may be sequentially arranged at the outbound stage of the ion implanter.

Finally, if a single material is used as both the blocking material and the polymeric dielectric precursor, the material application stage may be at the inbound stage of the ion implanter.

In an embodiment using a polymeric dielectric precursor, rather than using a separate material application stage, the polymeric dielectric precursor may be applied in the screen printer. The screen printer may be disposed downstream from the ion implanter and the heated chamber. This may be done by using the screen printer to first apply the polymeric dielectric precursor, and then to apply the metal paste. In another embodiment, the polymeric dielectric precursor and the metal paste may be done simultaneously.

In some embodiments, material is applied to the edges of the solar cells individually. In other embodiments, a plurality of solar cells may be stacked on top of one another and aligned. The material is then applied to this stack of solar cells at one time. This may have several advantages. First, the time to coat the stack of solar cells may be less than the time to coat each solar cell individually. Secondly, the stack also serves to cover the front and rear surfaces of the individual solar cells. This may ensure less blocking material or polymeric dielectric precursor is inadvertently applied to the front or rear surfaces of the solar cells. This stacking function may be performed immediately before the material application stage, which was described above.

In some embodiments, when a polymeric dielectric precursor is applied to the edges of the solar cell, the resulting solar cell may include an inorganic dielectric layer along its edge after processing. This inorganic dielectric layer may be left on the solar cell, or may be removed if desired. This inorganic dielectric layer may be amorphous silicon carbide. Further, the resulting solar cell may have fritted metal paste disposed on at least one of the front surface and the rear surface, where the fritted metal paste does not permeate the inorganic dielectric layer.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method for processing a solar cell comprising:
   applying a polymeric dielectric precursor to an edge of the solar cell;
   subjecting the solar cell to a thermal treatment after applying the polymeric dielectric precursor, where the polymeric dielectric precursor is transformed into an inorganic dielectric material by the thermal treatment; and
   screen printing fritted metal paste onto the solar cell after applying the polymeric dielectric precursor, wherein the inorganic dielectric material prevents the fritted metal paste from permeating the edge of the solar cell.

2. The method of claim 1, further comprising doping at least one surface of the solar cell, wherein the thermal treatment is also used to diffuse dopants into the solar cell.

3. The method of claim 1, further comprising implanting dopants into at least one surface of the solar cell, wherein the thermal treatment is also used to diffuse the dopants into the solar cell.

4. The method of claim 1, wherein the thermal treatment comprises a firing process used to diffuse the fritted metal paste.

5. The method of claim 1, wherein the thermal treatment is performed after the screen printing.

6. The method of claim 1, wherein the polymeric dielectric precursor is transformed into the inorganic dielectric material through UV illumination.

7. The method of claim 1, wherein the thermal treatment is performed at a temperature of less than 800° C.

8. The method of claim 1, wherein the polymeric dielectric precursor is applied using a screen printer.

9. The method of claim 8, wherein the polymeric dielectric precursor is applied contemporaneous with the fritted metal paste.

10. The method of claim 1, further comprising:
    implanting dopant into at least one surface of the solar cell, after applying the polymeric dielectric precursor so the polymeric dielectric precursor serves to block dopant from implanting the edge of the solar cell, where the implanting is performed prior to the thermal treatment.

11. The method of claim 1, wherein the polymeric dielectric precursor comprises poly(silylenemethylene).

12. A method of processing a solar cell, comprising:
    applying a blocking material to an edge of the solar cell;
    implanting dopants into at least one surface of the solar cell after applying the blocking material so the blocking material serves to block dopant from implanting the edge of the solar cell; and
    subjecting the solar cell to a thermal treatment after the implanting to diffuse the implanted dopants into the solar cell, wherein the blocking material is removed by the thermal treatment.

13. The method of claim 12, further comprising removing the blocking material after the implanting.

* * * * *